US010714174B2

(12) United States Patent
Lee

(10) Patent No.: US 10,714,174 B2
(45) Date of Patent: Jul. 14, 2020

(54) RESISTIVE MEMORY DEVICE AND OPERATING METHOD THEREOF

(71) Applicant: SK hynix Inc., Icheon (KR)

(72) Inventor: Jae-Yeon Lee, Gunpo (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/219,740

(22) Filed: Dec. 13, 2018

(65) Prior Publication Data

US 2019/0279709 A1    Sep. 12, 2019

(30) Foreign Application Priority Data

Mar. 9, 2018 (KR) .................. 10-2018-0027910

(51) Int. Cl.
*G11C 13/00* (2006.01)
*G11C 29/50* (2006.01)

(52) U.S. Cl.
CPC ........ *G11C 13/004* (2013.01); *G11C 13/0026* (2013.01); *G11C 13/0028* (2013.01); *G11C 13/0069* (2013.01); *G11C 29/50* (2013.01); *G11C 2029/5006* (2013.01)

(58) Field of Classification Search
CPC .............. G11C 13/004; G11C 13/0026; G11C 13/0028
USPC ........................................................ 365/148
See application file for complete search history.

(56) References Cited

U.S. PATENT DOCUMENTS

| 7,116,598 | B2 * | 10/2006 | Shimizu | G11C 7/062 |
| | | | | 365/210.1 |
| 7,203,112 | B2 * | 4/2007 | Liaw | G11C 7/062 |
| | | | | 365/158 |
| 7,286,429 | B1 * | 10/2007 | Liaw | G11C 7/02 |
| | | | | 365/158 |
| 7,688,617 | B2 * | 3/2010 | Sakimura | G06F 11/1044 |
| | | | | 365/158 |
| 7,835,210 | B2 * | 11/2010 | Shimizu | B82Y 10/00 |
| | | | | 365/158 |
| 8,510,633 | B2 * | 8/2013 | Sakimura | G06F 11/1008 |
| | | | | 365/200 |
| 9,042,152 | B2 * | 5/2015 | Kim | G11C 11/1673 |
| | | | | 365/129 |

(Continued)

FOREIGN PATENT DOCUMENTS

| KR | 1020140093507 A | 7/2014 |
| KR | 1020160101540 A | 8/2016 |
| KR | 1020170055222 A | 5/2017 |

*Primary Examiner* — Son L Mai

(57) ABSTRACT

A resistive memory device includes: a normal cell array suitable for including a plurality of memory cells and generating a cell current according to a resistance state of a memory cell selected based on an input address; a reference cell array suitable for including a plurality of sub-arrays each including a predetermined number of memory cells, and generating a reference current according to a combination of resistance states of memory cells of a sub-array, the sub-array being selected based on a reference selection signal; a sense amplifier circuit suitable for sensing and amplifying a signal indicative of data of the selected memory cell based on the cell current and the reference current during a read operation; and a reference cell selector suitable for generating the reference selection signal, the sub-array in the reference cell array corresponding to a position of the selected memory cell in the normal cell array.

22 Claims, 13 Drawing Sheets

(56) References Cited

U.S. PATENT DOCUMENTS 9,274,721 B2 * 3/2016 Oh .................. G06F 3/0655
10,192,618 B2 * 1/2019 Pyo .................. G11C 13/0069

* cited by examiner

RESISTIVE MEMORY DEVICE AND OPERATING METHOD THEREOF

CROSS-REFERENCE TO RELATED APPLICATION

The present application claims priority of Korean Patent Application No. 10-2018-0027910, filed on Mar. 9, 2018, which is incorporated herein by reference in its entirety.

BACKGROUND

1. Field

Embodiments of the present disclosure relate to semiconductor designing technology, and more particularly, to a resistive memory device and a method for operating the resistive memory device.

2. Description of the Related Art

Researchers and the industry are studying to develop the next-generation memory devices that are nonvolatile and need not be refreshed in response to the demands for high capacity and low power consumption of semiconductor memory devices. The next-generation memory devices are required to have high integration of a Dynamic Random Access Memory (DRAM), non-volatility of a flash memory, and high-speed performance of a Static Random Access Memory (SRAM). The next-generation memory devices drawing the attention from the researchers and the industry may include a Phase-Change Random Access Memory (PRAM), a Nano Floating Gate Memory (NFGM), a Polymer RAM (PoRAM), a Magnetic RAM (MRAM), a Ferroelectric RAM (FeRAM), and a Resistive RAM (RRAM).

The next-generation memory devices are resistive memories in a broad sense because they may represent the state of the cell data as the magnitude of the resistance value. Therefore, the resistive memory used in the description of the present disclosure may mean a memory device basically including the above-mentioned next-generation memory devices.

SUMMARY

Embodiments of the present disclosure are directed to a resistive memory device capable of adaptively generating a reference current according to a position of a memory cell and a temperature of a chip, and a method for operating the resistive memory device.

Embodiments of the present disclosure are directed to a resistive memory device capable of repairing a defective reference cell of a reference cell array that generates a reference current and a method for operating the resistive memory device.

In accordance with an embodiment of the present disclosure, a resistive memory device includes: a normal cell array suitable for including a plurality of memory cells and generating a cell current according to a resistance state of a memory cell selected among the plurality of memory cells based on an input address; a reference cell array suitable for including a plurality of sub-arrays each including a predetermined number of memory cells, and generating a reference current according to a combination of resistance states of memory cells of a sub-array, the sub-array being selected among the plurality of sub-arrays based on a reference selection signal; a sense amplifier circuit suitable for sensing and amplifying a signal indicative of data of the selected memory cell based on the cell current and the reference current during a read operation; and a reference cell selector suitable for generating the reference selection signal, the sub-array in the reference cell array corresponding to a position of the selected memory cell in the normal cell array.

In accordance with another embodiment of the present disclosure, a method for operating a resistive memory device includes: providing a normal cell array including a plurality of memory cells and a reference cell array including a plurality of sub-arrays each including a predetermined number of memory cells; generating a cell current according to a resistance state of a memory cell selected among the plurality of memory cells by an input address from the normal cell array; generating a reference selection signal to select a sub-array among the plurality of sub-arrays, the sub-array corresponding to a position of the selected memory cell in the normal cell array; generating a reference current according to a combination of resistance states of memory cells of the sub-array, the sub-array being selected among the plurality of sub-arrays based on the reference selection signal; and sensing and amplifying a signal indicative of data of the selected memory cell based on the cell current and the reference current.

In accordance with yet another embodiment of the present disclosure, a resistive memory device includes: a normal cell array suitable for including a plurality of memory cells and generating a cell current according to a resistance state of a memory cell selected based on an input address; a reference cell array suitable for including a sub-array including a predetermined number of memory cells, and generating a reference current according to a combination of resistance states of the memory cells of the sub-array; and a sense amplifier circuit suitable for sensing and amplifying a signal indicative of data of the selected memory cell based on the cell current and the reference current during a read operation.

DETAILED DESCRIPTION

Figure 1A:
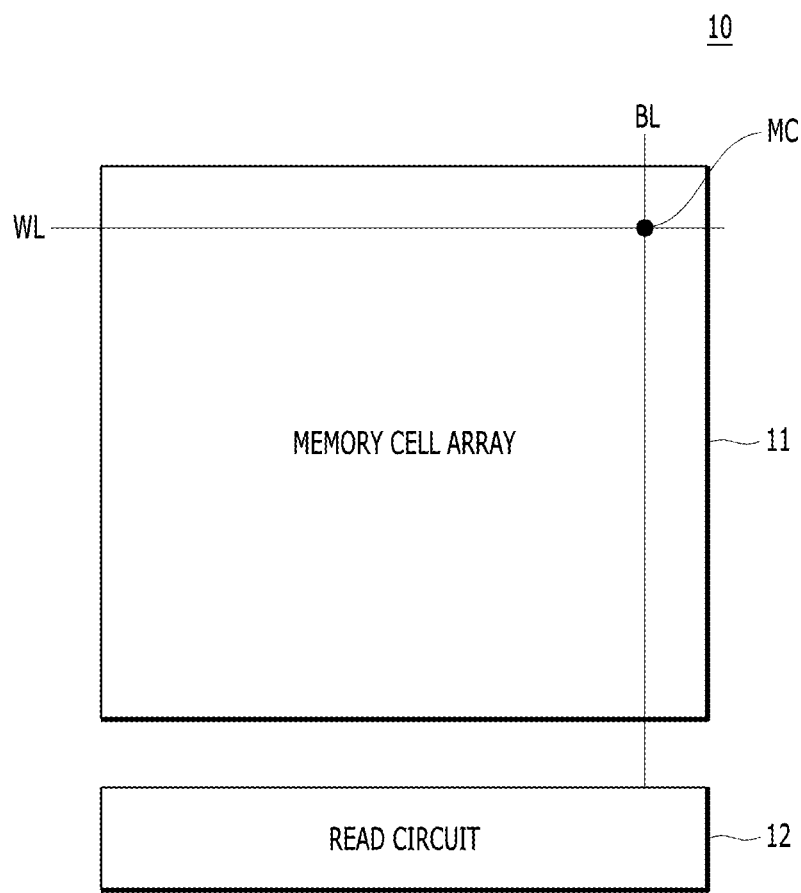
FIG. 1A is a block diagram illustrating a resistive memory device.

Embodiments of the present disclosure will be described below in more detail with reference to the accompanying drawings.

Embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Embodiments of the present disclosure will be described using a Resistive Random Access Memory (RRAM). However, the technology of the present disclosure may be applied to nonvolatile memory devices using resistors such as a Phase-Change Random Access Memory (PRAM) and a Magnetic Random Access Memory (MRAM).

FIG. 1A is a block diagram illustrating a resistive memory device 10. FIG. 1A illustrates some constituent elements related to a read operation of the resistive memory device 10 in order to sufficiently explain beneficial aspects of embodiments of the present disclosure.

Referring to FIG. 1A, the resistive memory device 10 may include a memory cell array 11 and a read circuit 12.

The memory cell array 11 may include a plurality of memory cells MC that are respectively coupled to a plurality of bit lines BL and a plurality of word lines WL and disposed at respective areas where the bit lines BL and the word lines WL intersect with each other. For example, the memory device 10 including the memory cell array 11 may be a memory device having a cross point structure. The memory cells MC may include resistive memory cells. Each memory cell MC may include a switching device and a variable resistive device. The read circuit 12 may perform a read operation on the memory cell array 11.

Figure 1B:
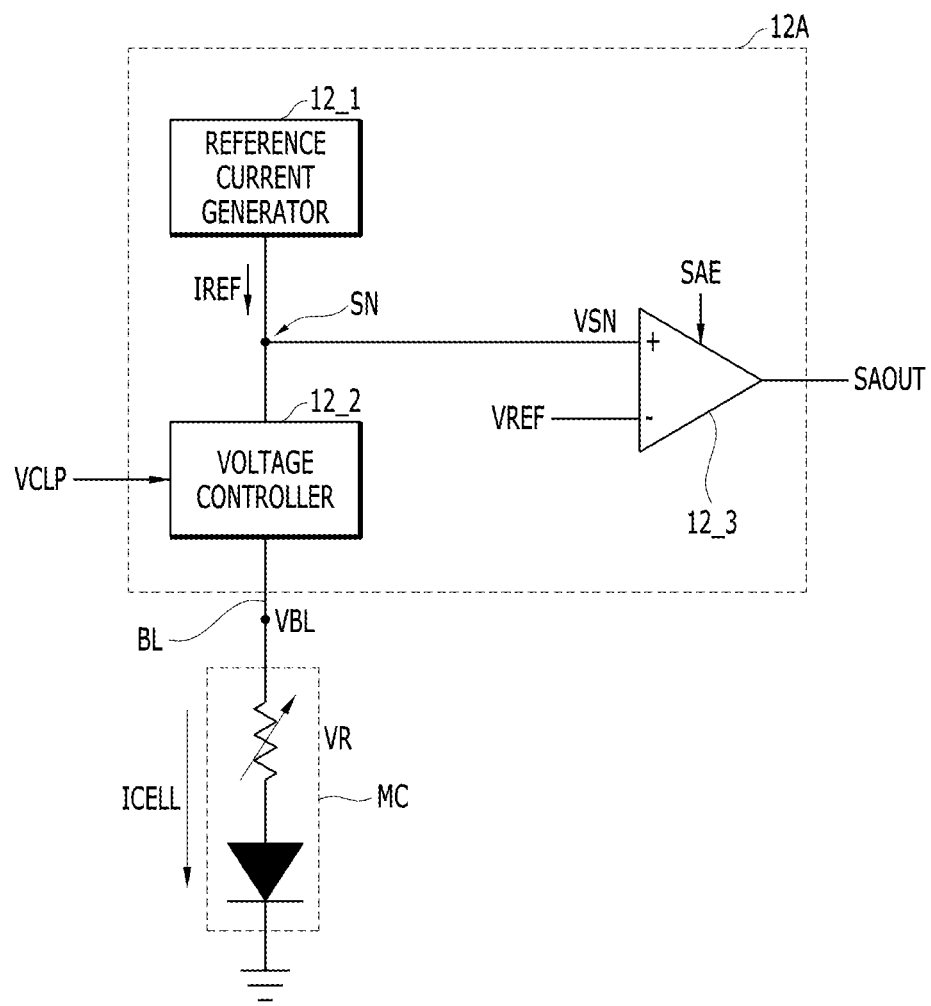
FIG. 1B is a circuit diagram illustrating a read circuit shown in FIG. 1A in accordance with an embodiment of the present disclosure.

FIG. 1B is a circuit diagram illustrating the read circuit 12 shown in FIG. 1A in accordance with an embodiment.

For the sake of convenience in description, FIG. 1B shows one sensing circuit 12A for sensing and amplifying a signal indicative of data in one memory cell MC, the sensing circuit 12A being a portion of the read circuit 12 shown in FIG. 1A. For example, the reading circuit 12 in FIG. 1A may include a plurality of sensing circuits (not shown), which include the sensing circuit 12A and are coupled to a plurality of memory cells through different bit lines BL.

A memory cell MC in FIG. 1B of a memory cell array (e.g., the memory cell array 11 in FIG. 1A) may be coupled to the sensing circuit 12A through a bit line BL. One end of the memory cell MC may be coupled to the bit line BL and the other end may be coupled to a word line. During a read operation for the memory cell MC, a voltage level of the word line may be substantially equal to a ground voltage level. Therefore, a voltage of the memory cell MC in FIG. 1B, that is, a cell voltage across the memory cell MC, may correspond to a bit line voltage VBL.

The sensing circuit 12A may include a reference current generator 12_1, a voltage controller 12_2, and a sense amplifier 12_3. However, embodiments of the present disclosure are not limited thereto. In other embodiments, the sensing circuit 12A may omit one or more of the constituent blocks shown in FIG. 1B, or may include additional constituent blocks (for example, a reference voltage generator for generating a reference voltage VREF).

The reference current generator 12_1 may generate a reference current IREF and provide the reference current IREF to a sensing node SN. In an embodiment, the reference current generator 12_1 may be implemented using a current mirror.

The voltage controller 12_2 may be coupled to the memory cell MC through the bit line BL. The voltage controller 12_2 may be coupled between the sensing node SN and the memory cell MC, and the voltage controller 12_2 may clamp the bit line voltage VBL within a given range. In an embodiment, the given range is a predetermined range suitable for sensing data stored in the memory cell MC. Specifically, the voltage controller 12_2 may clamp the bit line voltage VBL to a predetermined level according to a clamping signal VCLP. In other words, the bit line voltage VBL may be determined based on the clamping signal VCLP.

Meanwhile, the reference current IREF may be provided to the memory cell MC through the voltage controller 12_2. An amount of a cell current ICELL flowing through the memory cell MC may be changed based on a resistance value of a variable resistor VR. For example, when the resistance value of the variable resistor VR is relatively large (i.e., a high resistance state HRS), the cell current ICELL has a relatively small amount. On the other hand, when the resistance value of the variable resistor VR is relatively small (i.e., a low resistance state LRS), the cell current ICELL has a relatively large amount. For example, when the resistance value of the variable resistor VR is relatively large (i.e., the high resistance state HRS), the amount of current of the reference current IREF may be larger than that of the cell current ICELL. When the resistance value of the variable resistor VR is relatively small (i.e., the low resistance state LRS), the amount of current of the reference current IREF may be smaller than that of the cell current ICELL. When the amount of current of the reference current IREF is larger than that of the cell current ICELL, a level of a voltage (or a sensing voltage) VSN at the sensing node SN may increase. On the other hand, when the amount of current of the reference current IREF is smaller than that of the cell current ICELL, the level of the sensing voltage VSN at the sensing node SN may decrease.

The sense amplifier 12_3 may compare the sensing voltage VSN of the sensing node SN with the reference voltage VREF, sense the data stored in the memory cell MC based on the result of the voltage comparison, and generate an output signal SAOUT. The sense amplifier 12_3 may perform a sensing operation at a sensing time at which a sense amplifier enable signal SAE is activated. For example, the sensing voltage VSN may be applied to a non-inverting input terminal of the sense amplifier 12_3, and the reference voltage VREF may be applied to an inverting input terminal of the sense amplifier 12_3. The sense amplifier 12_3 may generate the output signal SAOUT having a first logic value (e.g., a logic high level) when the sensing voltage VSN is greater than the reference voltage VREF and generate the output signal SAOUT having a second logic value (e.g., a logic low level) when the sensing voltage VSN is smaller than the reference voltage VREF.

Figure 2A:
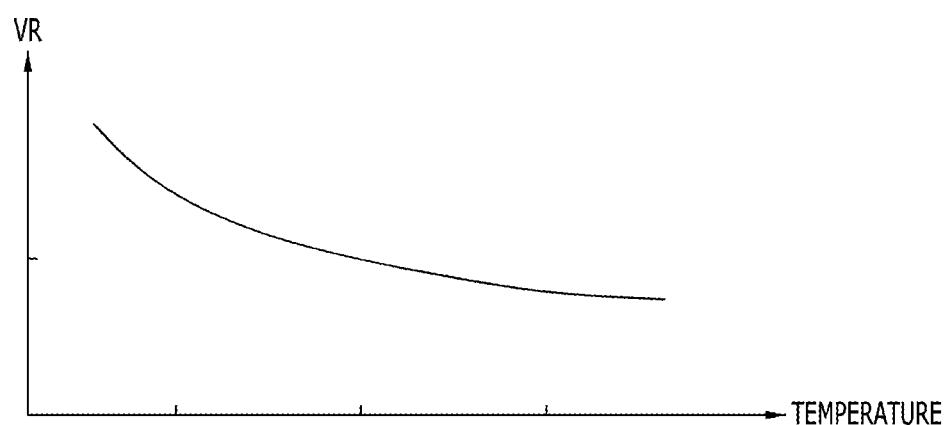
FIGS. 2A and 2B are graphs showing characteristics of a variable resistor of a memory cell and characteristics of a cell current, respectively, which vary with a temperature.
Figure 2B:
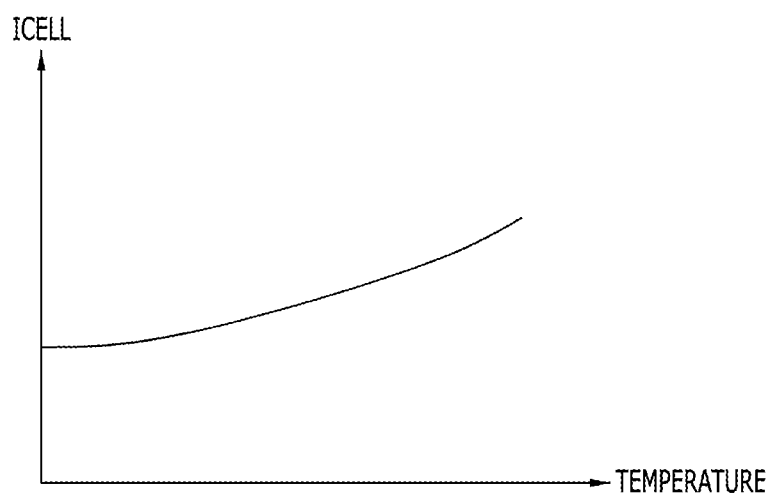
Figure 3A:
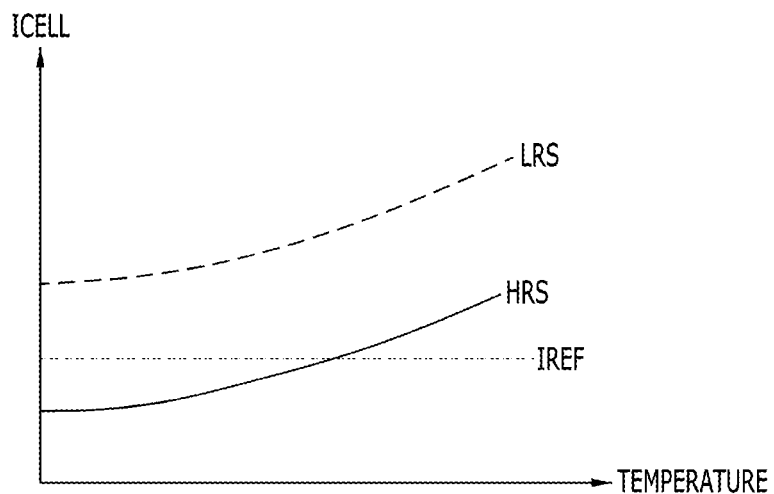
FIG. 3A is a graph illustrating an operation of a sensing circuit using a predetermined reference current and FIG. 3B is a graph illustrating an operation of a sensing circuit using a reference current on which temperature compensation is performed.

FIGS. 2A and 2B are graphs showing characteristics of the variable resistor VR and the cell current ICELL of the memory cell MC in FIG. 1B, respectively, which vary with a temperature. FIG. 3A is a graph illustrating an operation of the sensing circuit 12A in FIG. 1B using a predetermined reference current IREF and FIG. 3B is a graph illustrating an operation of the sensing circuit 12A using a reference current IREF on which temperature compensation is performed.

Referring to FIGS. 2A and 2B, as the temperature changes, the resistance value of the variable resistor VR of the memory cell MC may vary. In other words, as the temperature rises, the resistance value of the variable resistor VR of the memory cell MC may decrease while the amount of the cell current ICELL flowing through the memory cell MC may increase. On the other hand, as the temperature decreases, the resistance value of the variable resistor VR of the memory cell MC may increase while the amount of the cell current ICELL flowing through the memory cell MC may decrease.

Referring to FIG. 3A, the sensing circuit 12A of FIG. 1B using the predetermined reference current IREF may incorrectly determine whether the memory cell MC is in the high resistance state HRS or the low resistance state LRS, as shown in FIG. 3A. Specifically, the amount of the cell current ICELL flowing through the memory cell MC in the high resistance state HRS at a relatively high temperature becomes greater than that of the predetermined reference current IREF, and thus the sensing circuit 12A of FIG. 1B may determine that the memory cell MC is in the low resistance state LRS, rather than being in the high resistance state HRS.

Figure 3B:
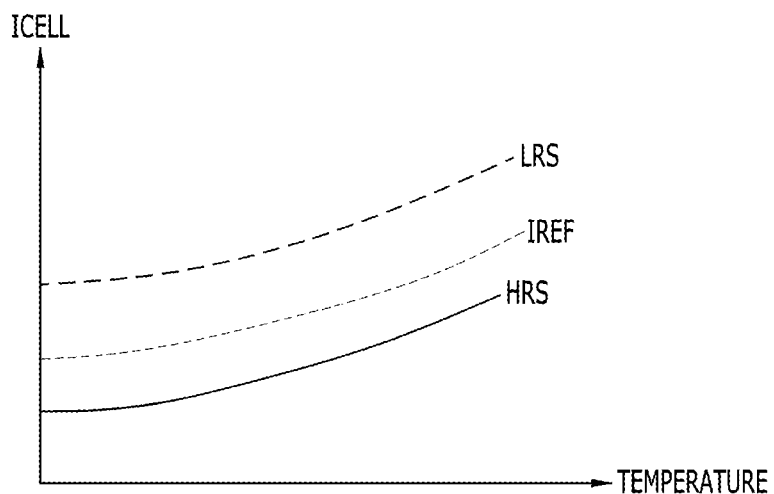

Therefore, as illustrated in FIG. 3B, the reference current IREF for determining whether the memory cell MC is in the high resistance state HRS or the low resistance state LRS may be compensated such that the amount of the reference current IREF increases as the temperature increases to secure the sensing margin of the sensing circuit 12A. Also, because the variation of the resistance value depending on the temperature may have a non-linear characteristic, a compensation scheme for the non-linear characteristic may be desirable.

In a proposed scheme, a thermo-sensor is disposed in a chip to perform a temperature compensation and a reference current generation is generated based on the temperature compensation result. However, the space for disposing the thermo-sensor and power consumption for operating the thermo-sensor may deteriorate the performance of the chip. Also, as the size of a memory cell array increases, a sneak current increases according to a temperature of a material forming a switching device in a memory cell, leading to limitations in performing the temperature compensation on each memory cell.

Meanwhile, in the memory device 10 of FIG. 1A, in which one memory cell MC is disposed in an area where one word line WL and one bit line BL intersect with each other, the memory cell array 11 may be divided into a plurality of areas (e.g., a near area, a center area, and a far area) based on distances from the read circuit 12 to memory cells in the plurality of areas, respectively. Herein, there is a mismatch between line resistances of the respective memory cells according to where each of the memory cells is positioned in one of the near area, the center area, and the far area. Therefore, the sensing margin of a sensing circuit (e.g., the sensing circuit 12A in FIG. 1B) may be secured by adaptively generating the reference current IREF according to the position of the memory cell.

Figure 4:
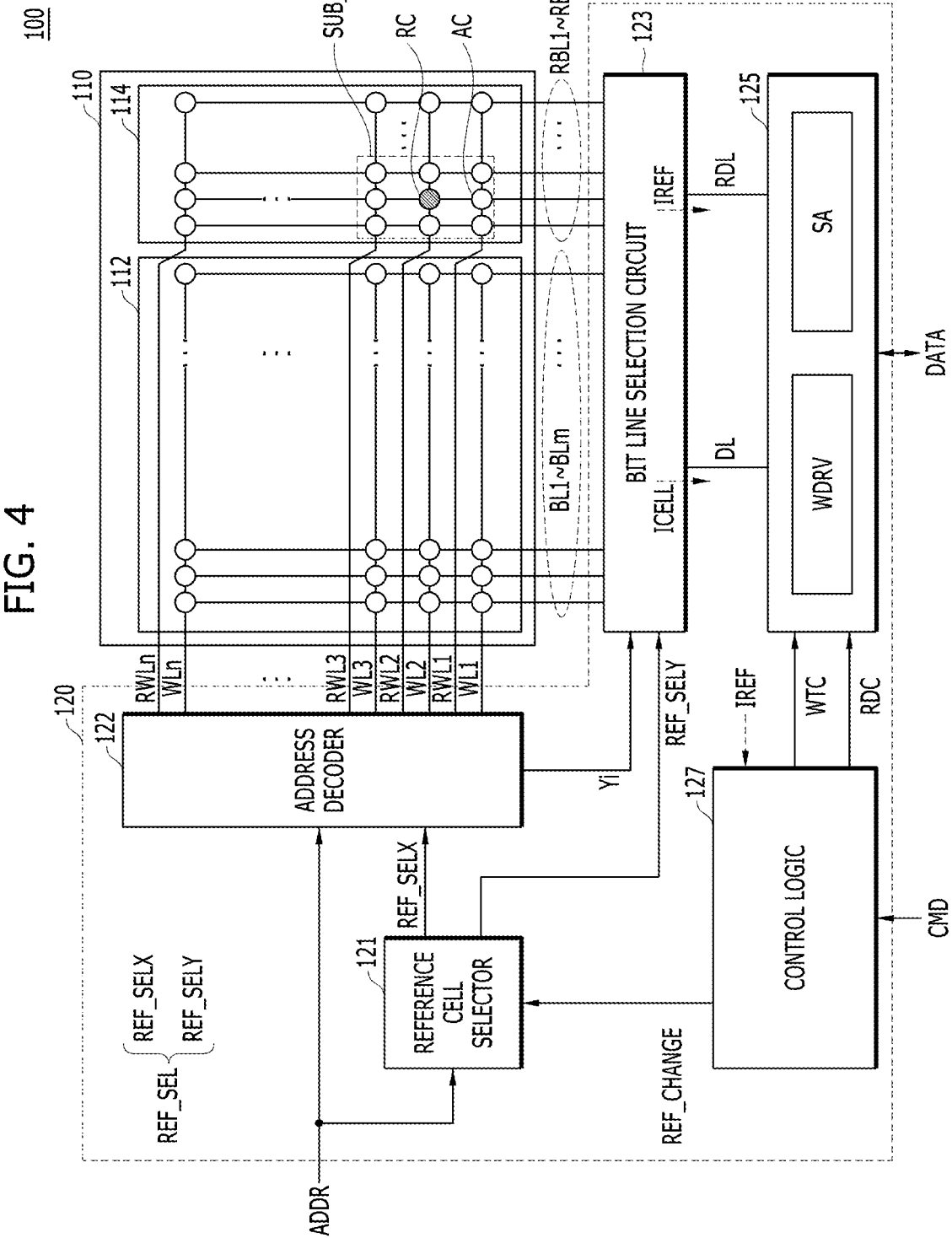
FIG. 4 is a block diagram illustrating a resistive memory device in accordance with an embodiment of the present disclosure.
Figure 5:
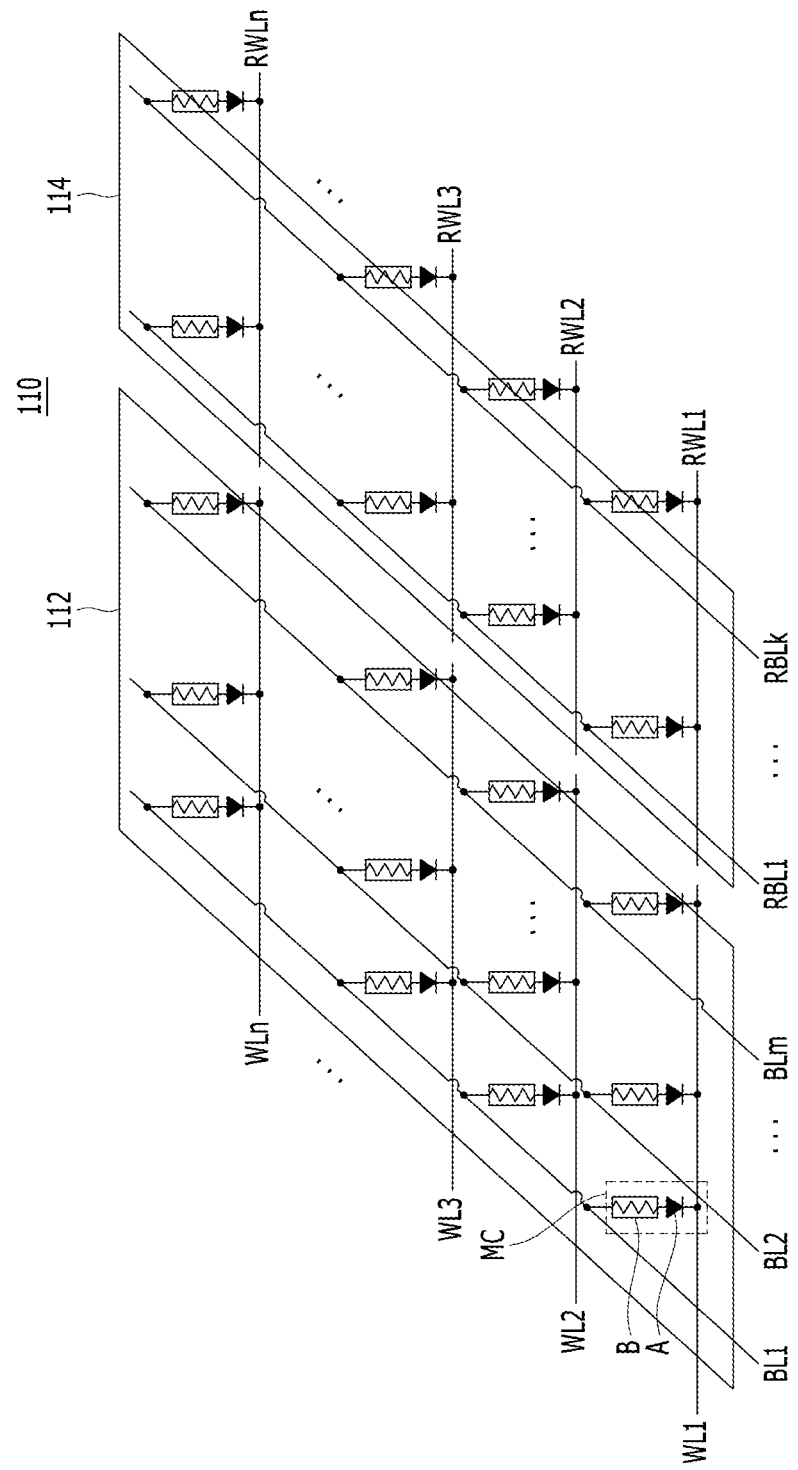
FIG. 5 is a schematic diagram illustrating a structure of a memory cell array shown in FIG. 4.

Hereinafter, a resistive memory device capable of performing temperature compensation and position compensation will be described in more detail FIG. 4 is a block diagram illustrating a resistive memory device 100 in accordance with an embodiment of the present disclosure. FIG. 5 is a schematic diagram illustrating a structure of the memory cell array 110 shown in FIG. 4.

Referring to FIG. 4, the resistive memory device 100 may include a memory cell array 110 and a peripheral circuit 120.

The memory cell array 110 may include a plurality of memory cells that are coupled to a plurality of first signal lines (e.g., a plurality of word lines WL1 to WLn and a plurality of reference word lines RWL1 to RWLn) and a plurality of second signal lines (e.g., a plurality of bit lines BL1 to BLm and a plurality of reference bit lines RBL1 to RBLk), and are disposed in areas where the first signal lines and the second signal lines intersect with each other. For example, the memory device including the memory cell array 110 may be a memory device having a cross point structure. The memory cells may include resistive memory cells.

Referring to FIG. 5, a first resistive memory cell MC may be disposed in an area where each of the bit lines BL1 to BLm intersects with a corresponding one of the word lines WL1 to WLn, and a second resistive memory cells MC may be disposed in an area where each of the reference bit lines RBL1 to RBLk and a corresponding one of the reference word lines RWL1 to RWLn intersect with each other. The bit lines BL1 to BLm and the reference bit lines RBL1 to RBLk may extend in a first direction, and the word lines WL1 to WLn and the reference word lines RWL1 to RWLn may extend in a second direction which intersects with the first direction. Each memory cell MC may include a switching device A and a variable resistive device B. The switching device A may be implemented using one or more of various elements such as a MOS transistor, a diode, and the like. The variable resistive device B may include an upper electrode, a lower electrode, and a transition metal oxide interposed between the upper electrode and the lower electrode.

Referring back to FIG. 4, the memory cell array 110 may include a normal cell array 112 and a reference cell array 114.

The normal cell array 112 may include a plurality of memory cells that are coupled to the plurality of word lines WL1 to WLn and the plurality of bit lines BL1 to BLm. The normal cell array 112 may output the cell current ICELL corresponding to the resistance state of a selected memory cell among the plurality of memory cells in the normal cell array 112 to the bit line coupled to the selected memory cell.

The reference cell array 114 may include a plurality of memory cells that are coupled to the plurality of reference word lines RWL1 to RWLn and the plurality of reference bit lines RBL1 to RBLk. The reference word lines RWL1 to RWLn may be separate and distinct from the word lines WL1 to WLn, and the reference bit lines RBL1 to RBLk may also be separate and distinct from the bit lines BL1 to BLm.

The reference cell array 114 may be disposed on one side of the normal cell array 112 in a direction (or a word line direction) in which the word lines WL1 to WLn extend. The reference cell array 114 may be divided into a plurality of sub-arrays SUB_ARY. Each of the plurality of sub-arrays SUB_ARY may include at least one reference cell RC and at least one neighboring cell AC disposed around the reference cell RC.

For example, assuming that the reference cell RC is disposed at an intersection between a reference word line RWLi and a reference bit line RBLj, each of the neighboring cells AC may share the reference bit line RBLj and be coupled to one of neighboring reference word lines (i.e., RWLi+1 and RWLi−1), or may share the reference word line RWLi and be coupled to one of neighboring reference bit lines (i.e., RBLj+1 and RBLj−1). In a broader sense, the neighboring cells AC may further include memory cells, each of which is coupled to one of the neighboring reference word lines RWLi+1 and RWLi−1 and one of the neighboring reference bit lines RBLj+1 and RBLj−1. In other words, the neighboring cells AC may include memory cells in a region defined by the neighboring reference word lines RWLi+1 and RWLi−1 and the neighboring reference bit lines RBLj+1 and RBLj−1. Although it is illustrated in FIG. 4 that there are one reference cell RC and eight neighboring cells disposed around the reference cell RC, embodiments of the present disclosure are not limited thereto. According to an embodiment of the present disclosure, memory cells coupled to +/−2 or +/−3 lines of the reference word line RWLi or the reference bit line RBLj may be regarded as the neighboring cells AC.

For example, the neighboring memory cells AC may include memory cells in a region defined by a pair of reference word lines RWLi+2 and RWLi−2 and a pair of reference bit lines RBLj+2 and RBLj−2, or memory cells in a region defined by a pair of reference word lines RWLi+3 and RWLi−3 and a pair of reference bit lines RBLj+3 and RBLj-3.

The neighboring cells AC may be cells programmed into a first resistance state (e.g., a high resistance state HRS) or a second resistance state (e.g., a low resistance state LRS). In other words, the reference cell array 114 may output a reference current IREF corresponding to a combination of the resistance state of the reference cell RC and the resistance states of the neighboring cells AC of the selected sub-array SUB_ARY to a reference bit line coupled to the reference cell RC. In the reference cell array 114, the programmed neighboring cells AC are disposed around the reference cell RC so that the resistance states of the neighboring cells AC in the selected sub array SUB_ARY are reflected into the reference cell RC as a temperature condition. Therefore, the reference cell array 114 may output the reference current IREF corresponding to the resistance state of the temperature-compensated reference cell RC to the reference bit line.

The peripheral circuit 120 may include a reference cell selector 121, an address decoder 122, a bit line selection circuit 123, a data input/output circuit 125, and a control logic 127. The data input/output circuit 125 may include a write driver WDRV and a sense amplifier circuit SA.

The reference cell selector 121 may generate a reference selection signal REF_SEL for selecting the sub-array SUB_ARY among a plurality of sub-arrays based on an address ADDR inputted from outside during a write or read operation. The reference selection signal REF_SEL may include a first reference cell selection signal REF_SEL_X for activating a reference word line coupled to the reference cell RC of the selected sub-array SUB_ARY, and a second reference cell selection signal REF_SEL_Y for selecting a reference bit line coupled to the reference cell RC of the selected sub-array SUB_ARY. In other words, when the reference cell RC is defined based on the first reference cell selection signal REF_SEL_X and the second reference cell selection signal REF_SEL_Y, the sub-array SUB_ARY including the reference cell RC and the neighboring cells AC disposed around the reference cell RC may be defined.

For example, assuming that a reference cell RC (hatched one) disposed at an intersection between a second reference word line RWL2 and a second reference bit line RBL2 is selected according to the first reference cell selection signal REF_SEL_X and the second reference cell selection signal REF_SEL_Y, a sub array SUB_ARY including the reference cell RC and neighboring cells AC disposed around the reference cell RC is defined. By programming the neighboring cells AC, the resistance states of the neighboring cells AC are reflected into the reference cell RC as a temperature condition. For example, one or more currents may flow through one or more neighboring cells AC, respectively, when the reference cell RC is selected and a current may flow through the reference cell RC. Because the reference current IREF is determined based on the current flowing through the reference cell RC as well as the currents flowing through the one or more neighboring cells AC, the resistance states of the neighboring cells AC can be reflected into the reference cell RC when the reference current IREF is generated. Further, the resistance values of the programmed neighboring cells AC may vary with a temperature as well as that of the reference cell RC. Because the current amount flowing through the one or more neighboring cells AC varies with a temperature, the temperature condition may be considered to generate the reference current IREF by programming the resistance states of the neighboring cells AC. As a result, the reference cell array 114 may output a reference current IREF corresponding to a combination of the resistance state of the reference cell RC and the resistance states of the neighboring cells AC of the selected sub-array SUB_ARY.

Meanwhile, the memory cell array 110 may be divided into a near area, a center area, and a far area according to distances from the sense amplifier circuit SA to memory cells included in the near area, the center area, and the far area, respectively. That is, the normal cell array 112 and the reference cell array 114 may be divided into a near area, a center area, and a far area. The reference cell selector 121 may generate a reference selection signal REF_SEL to select the sub-array SUB_ARY positioned in the same area based on where the memory cell of the normal cell array 112 corresponding to the address ADDR is positioned in the near area, the center area, and the far area. For example, the reference cell selector 121 may select a sub-array SUB_ARY in the near area of the reference cell array 114 when the memory cell corresponding to the address ADDR is positioned in the near area of the normal cell array 112.

Also, the reference cell selector 121 may set one of the neighboring cells AC of the previously selected sub-array as a new reference cell according to a repair control signal REF_CHANGE provided from the control logic 127, and update the first reference cell selection signal REF_SEL_X and the second reference cell selection signal REF_SEL_Y for selecting the new reference cell. According to an embodiment of the present disclosure, the reference cell selector 121 may be able to select one among the neighboring cells AC positioned on a diagonal line of the previously selected sub-array as the new reference cell because the neighboring cells AC sharing the same word line or the same bit line with the reference cell RC are more vulnerable to disturbance. Alternatively, in order to minimize the influence of the disturbance, when the reference cell RC is coupled to a reference word line RWLi and a reference bit line RBLj, the reference cell selector 121 may be able to set a memory cell which is coupled to the same reference word line RWLi and a reference bit line RBLj+L or RBLj−L (where L is a positive integer of 2 or more) as a new reference cell. When the new reference cell RC is defined based on the first reference cell selection signal REF_SEL_X and the second reference cell selection signal REF_SEL_Y, a new reference cell RC and a new sub-array SUB_ARY including a plurality of neighboring cells AC positioned around the new reference cell RC may be defined.

The address decoder 122 may decode an external address ADDR to generate a word line driving signal (not shown) for activating one of the word lines WL1 to WLn during a write or read operation. Also, the address decoder 122 may be able to activate a column selection signal Yi for selecting one among the bit lines BL1 to BLm by decoding the address ADDR. By selecting a particular word line and a particular column line, the memory cell of the normal cell array 112 corresponding to the address ADDR may be selected. Also, in an embodiment of the present disclosure, the address decoder 122 may generate a reference word line driving signal (not shown) for activating one among the reference word lines RWL1 to RWLn based on the first reference cell selection signal REF_SEL_X. Although not illustrated in FIG. 4, the control logic 127 may control the address decoder 122. Meanwhile, although FIG. 4 illustrates the reference cell selector 121 is a structure distinct and separate from the address decoder 122. However, the reference cell selector 121 may be included in the address decoder 122 according to an embodiment of the present disclosure.

The bit line selection circuit 123 may select one among the bit lines BL1 to BLm based on a column selection signal Yi and couple the selected bit line with a data line DL during a read operation or a write operation, and it may select one among the reference bit lines RBL1 to RBLk based on a second reference cell selection signal REF_SEL_Y and couple the selected reference bit line with a reference data line RDL. Although not illustrated in FIG. 4, the control logic 127 may control the bit line selection circuit 123. The bit line selection circuit 123 may be disposed on one side of the memory cell array 110 in a direction (or a bit line direction) that the bit lines BL1 to BLm extend.

The write driver WDRV may be controlled based on a write control signal WTC applied from the control logic 127 and supply a write current to the bit lines BL1 to BLm of the normal cell array 112. The write driver WDRV may be coupled to the normal cell array 112 through the data lines DL and the bit lines BL1 to BLm. Also, in embodiments of the present disclosure, the write driver WDRV may supply the write current to the reference bit lines RBL1 to RBLk of the reference cell array 114 based on the write control signal WTC applied from the control logic 127. The write driver WDRV may be coupled to the reference cell array 114 through the reference data lines RDL and the reference bit lines RBL1 to RBLk.

The write driver WDRV may be able to program each of the neighboring cells AC of a sub-array SUB_ARY to a first resistance state (e.g., the high resistance state HRS) or a second resistance state (e.g., the low resistance state LRS) using the reference bit lines RBL1 to RBLk before a write operation is performed. The write driver WDRV may simultaneously program the selected memory cell of the normal cell array 112 and the reference cell RC of the sub-array SUB_ARY corresponding thereto during the write operation. The write driver WDRV may program the reference cell RC of the sub-array SUB_ARY to have a resistance value between the high resistance state HRS and the low resistance state LRS. According to an embodiment of the present disclosure, the reference cell RC of each sub-array SUB_ARY may be programmed to have an average of resistance values of the high resistance state HRS and the low resistance state LRS.

The sense amplifier circuit SA may be controlled based on the read control signal RDC applied from the control logic 127 and sense and amplify a signal indicative of the data of the selected memory cell of the normal cell array 112 based on the cell current ICELL from the selected memory cell of the normal cell array 112 and the reference current IREF from the reference cell RC of the reference cell array 114 during a read operation. The sense amplifier circuit SA may be coupled to the normal cell array 112 through the data lines DL and the bit lines BL1 to BLm, and may be coupled reference cell array 114 through the reference data lines RDL and the reference bit lines RBL1 to RBLk. Because the configuration of the sense amplifier circuit SA of FIG. 4 is substantially the same as that of the sensing circuit 12A of FIG. 1B except that the reference current IREF is supplied from the reference cell array 114 of FIG. 4 instead of the reference current generator 12_1 of FIG. 1B, detailed descriptions on its operation may be omitted herein for the interest of brevity.

The write driver WDRV and the sense amplifier circuit SA may be disposed on one side of the memory cell array 110 in the bit line direction. Although FIG. 4 illustrates that there are one write driver WDRV and one sense amplifier circuit SA, they may be provided as a structure corresponding to the bit lines BL1 to BLm of the normal cell array 112 and a structure corresponding to the reference bit lines RBL1 to RBLk of the reference cell array 114 according to an embodiment of the present disclosure.

The control logic 127 may control various operations in the resistive memory device 100 in general based on a command CMD applied from an external controller (not shown). The control logic 127 may generate a write control signal WTC and a read control signal RDC for controlling read and write operations, respectively.

Also, in an embodiment of the present disclosure, the control logic 127 may determine whether the reference cell RC of the sub-array is a defective cell or not based on the reference current IREF from the reference cell array 114. When the reference current IREF is within a predetermined target range, the control logic 127 may determine the reference cell RC as a good cell. When the reference current IREF is out of the predetermined target range, the control logic 127 may determine whether the reference cell RC is a defective cell or not and whether one or more of the resistance states programmed in the neighboring cells AC need to be adjusted (or trimmed).

Specifically, when the reference current IREF does not have a predetermined amount of current in a state that the reference current IREF is out of the predetermined target range, the control logic 127 may determine the reference cell RC as a defective cell. Accordingly, the control logic 127 may generate a repair control signal REF_CHANGE and supply the repair control signal REF_CHANGE to the reference cell selector 121. On the other hand, when the reference current IREF is out of the predetermined target range but has a predetermined amount of current, the control logic 127 may determine that the reference cell RC is not a defective cell but one or more of the resistance states programmed in the neighboring cells AC need to be adjusted (i.e., trimmed). In an embodiment, the reference current IREF has the predetermined amount of current when the amount of the reference current IREF is substantially equal to the predetermined amount of current, for example, within a range of 95% to 105%, 97% to 103%, 99% to 101%, 99.5% to 100.5%, 99.7% to 100.3%, or 99.9% to 100.1% of the predetermined amount of current. Accordingly, the control logic 127 may generate the write control signal WTC and provide the write control signal WTC to the write driver WDRV.

Although FIG. 4 illustrates an embodiment where the reference current IREF is directly inputted to the control logic 127, embodiments of the present disclosure are not limited thereto. For example, when the sense amplifier circuit SA has substantially the same configuration as the sensing circuit 12A of FIG. 1B, whether the reference cell RC is defective or not may be determined based on the sensing voltage VSN or the output signal SAOUT of the sensing node SN.

There is a mismatch between the line resistors of the memory cells based on where each memory cell is positioned in the near area, the center area, and the far area. In an embodiment of the present disclosure, it is possible to minimize the influence of the mismatch based on the locations of the memory cells by selecting a sub-array (e.g., a sub-array SUB_ARY in FIG. 4) in a reference cell array (e.g., the reference cell array 114 in FIG. 4) based on a position of a selected memory cell in a normal cell array (e.g., the normal cell array 112 in FIG. 4), and generating a reference current (e.g., the reference current IREF in FIG. 4) based on a reference cell (e.g., the reference cell RC in FIG. 4) of the selected sub-array. At the same time, in this embodiment of the present disclosure, it is possible to set the thermal environments of the reference cell as close as possible to those of a corresponding memory cell in the normal cell array by disposing neighboring cells (e.g., the neighboring cells AC in FIG. 4) around the reference cell and programming the neighboring cells to the high resistance state HRS or the low resistance state LRS. Accordingly, when a temperature increases or decreases, it is possible to generate a reference current corresponding to the resistance state of the reference cell in which the temperature condition of the neighboring cells in the selected sub-array is reflected. Therefore, an embodiment of the present disclosure may be able to secure the sensing margin and minimize a read error by generating the reference current by performing the position compensation of the memory cell and the temperature compensation of a chip.

Also, according to an embodiment of the present disclosure, when the reference cell is a defective cell, the defective reference cell may be repaired using one among the neighboring cells of the previously selected sub-array, thereby improving the yield.

Hereinafter, structures of the memory cell array are described with reference to FIG. 6 to FIG. 9B. For the sake of convenience in description, in FIG. 6 to FIG. 9B, elements corresponding to the bit line selection circuit 123 and the data line DL and the reference data line RDL of FIG. 4 may be omitted, and elements corresponding to the memory cell array 110 and the sense amplifier circuit SA of FIG. 4 may be shown. Also, FIG. 6 to FIG. 9B illustrate embodiments where a half of the neighboring cells of each sub-array are programmed to the high resistance state HRS and the other half are programmed to the low resistance state LRS.

Figure 6:
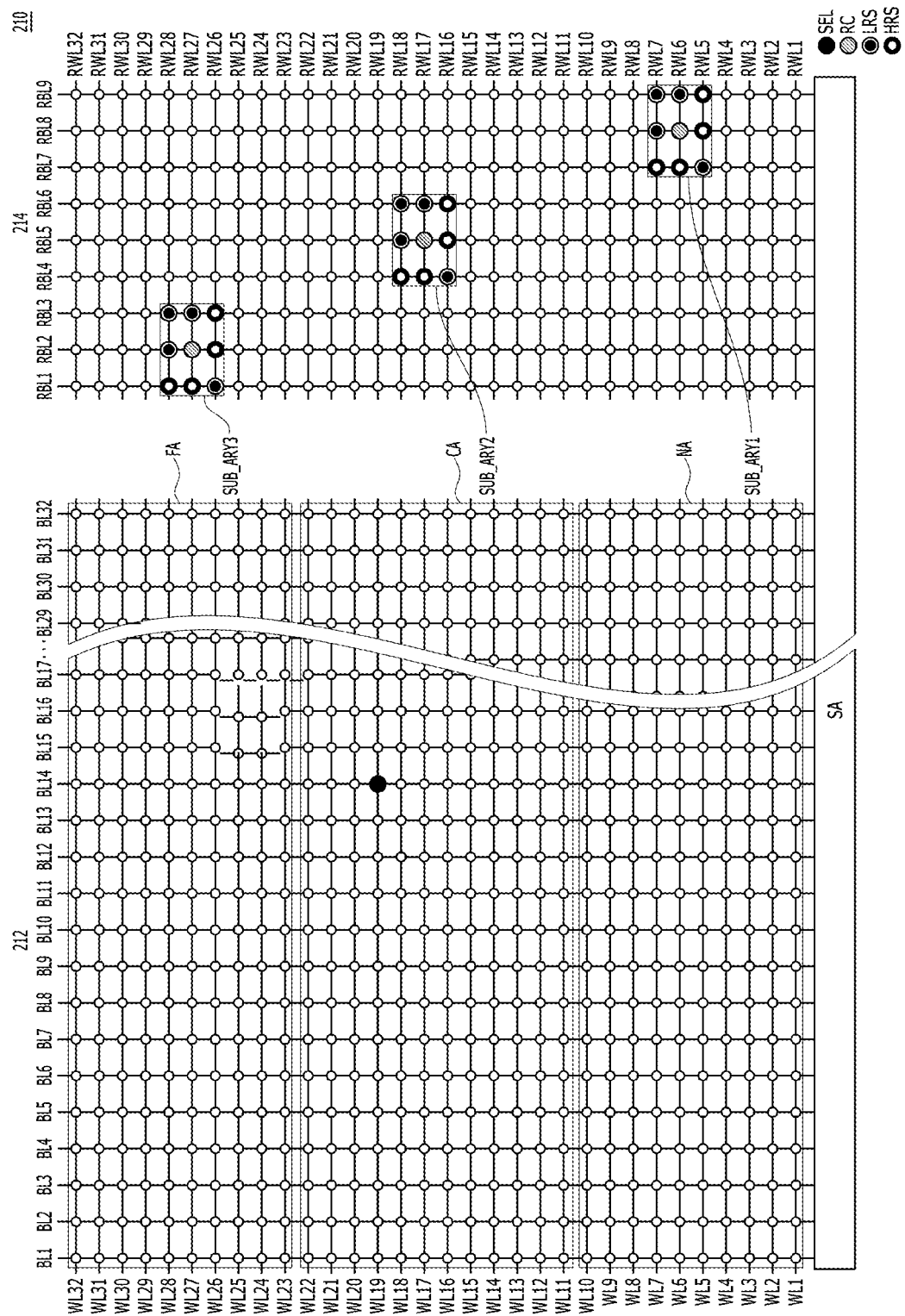
FIG. 6 shows a structure of a memory cell array in accordance with an embodiment of the present disclosure.

FIG. 6 shows a structure of a memory cell array 210 in accordance with an embodiment of the present disclosure.

Referring to FIG. 6, first to $32^{nd}$ word lines WL1 to WL32 and first to $32^{nd}$ column lines BL1 to BL32 may be disposed in a normal cell array 212. In other words, FIG. 6 shows an embodiment where the normal cell array 212 is provided with 1024 memory cells. Also, the reference cell array 214 may include first to $32^{nd}$ reference word lines RWL1 to RWL32 and first to ninth reference bit lines RBL1 to RBL9. That is, the reference cell array 214 shown in FIG. 6 includes 288 memory cells.

The normal cell array 212 may be divided into a first area (e.g., a near area) NA, a second area (e.g., a center area) CA, and a third area (e.g., a far area) FA based on distances from the sense amplifier circuit SA to memory cells in the near area NA, the center area CA, and the far area FA, respectively. The reference cell array 214 may include first to third sub-arrays SUB_ARY1 to SUB_ARY3 that respectively correspond to the near area NA, the center area CA, and the far area FA of the normal cell array 212. That is, when at least one of the memory cells of the near area NA of the normal cell array 212 is selected, the first sub-array SUB_ARY1 may be selected, and when at least one of the memory cells of the center area CA of the normal cell array 212 is selected, the second sub-array SUB_ARY2 may be selected, and when at least one of the memory cells of the far area FA of the normal cell array 212 is selected, the third sub-array SUB_ARY3 may be selected.

The reference cell array 214 may also be divided into a first area (e.g., a near area), a second area (e.g., a center area), and a third area (e.g., a far area) based on distances from the sense amplifier circuit SA to memory cells in the first, second, and third sub-arrays SUB_ARY1, SUB_ARY2, and SUB_ARY3, respectively. For example, when the near area NA of the normal cell array 212 includes memory cells within a first distance from the sense amplifier circuit SA in the bit line direction, the near area of the reference cell array 214 includes memory cells within the first distance from the sense amplifier circuit SA in the bit line direction. When the center area CA of the normal cell array 212 includes memory cells between the first distance and a second distance from the sense amplifier circuit SA in the bit line direction, the center area of the reference cell array 214 includes memory cells between the first distance and the second distance. According to an embodiment of the present disclosure, the first to third sub-arrays SUB_ARY1 to SUB_ARY3 may be disposed in a substantially diagonal direction of the reference cell array 214, and may be coupled to different reference bit lines and different reference word lines. For example, the first sub-array SUB_ARY1 may include memory cells that are disposed between the fifth to seventh reference word lines RWL5 to RWL7 and the seventh to ninth reference bit lines RBL7 to RBL9. The second sub-array SUB_ARY2 may include memory cells that are disposed between the $16^{th}$ to $18^{th}$ reference word lines RWL16 to RWL18 and the fourth to sixth reference bit lines RBL4 to RBL6. The third sub-array SUB_ARY3 may include memory cells that are disposed between the $26^{th}$ to $28^{th}$ reference word lines RWL26 to RWL28 and the first to third reference bit lines RBL1 to RBL3. However, embodiments of the present disclosure are not limited thereto. For example, the first sub-array SUB_ARY1 (not shown) may include memory cells that are disposed between the fifth to seventh reference word lines RWL5 to RWL7 and the first to third reference bit lines RBL1 to RBL3, the second sub-array SUB_ARY2 may include memory cells that are disposed between the $16^{th}$ to $18^{th}$ reference word lines RWL16 to RWL18 and the fourth to sixth reference bit lines RBL4 to RBL6, and the third sub-array SUB_ARY3 (not shown) may include memory cells that are disposed between the $26^{th}$ to $28^{th}$ reference word lines RWL26 to RWL28 and the seventh to ninth reference bit lines RBL7 to RBL9. In other embodiments, the first to third sub-arrays SUB_ARY1 to SUB_ARY3 may be substantially aligned in a bit line direction.

A reference cell selector (e.g., the reference cell selector 121 in FIG. 4) may select a sub-array SUB_ARY positioned in the same area depending on where the memory cell of the normal cell array 212 corresponding to the address ADDR is positioned. For example, in the normal cell array 212, when a selected memory cell SEL coupled to the $19^{th}$ word line WL19 and the $14^{th}$ bit line BL14 is positioned in the center area CA, the reference cell selector 121 may generate a reference selection signal REF_SEL to select the second sub-array SUB_ARY2 positioned in the center area of the reference cell array 214. Accordingly, the reference cell RC of the second sub-array SUB_ARY2 disposed between the $17^{th}$ reference word line RWL17 and the $5^{th}$ reference bit line RBL5 may be selected.

The sense amplifier circuit SA may sense and amplify a signal indicative of data of the selected memory cell of the normal cell array 212 based on a cell current supplied from the $14^{th}$ bit line BL14 and a reference current supplied from the fifth reference bit line RBL5 during a read operation.

Meanwhile, although FIG. 6 shows an embodiment where the normal cell array 212 is divided into three areas NA, CA, and FA, the normal cell array 212 may be divided into more areas based on distances from the sense amplifier circuit SA to memory cells in these areas, respectively. In this case, there may be as many sub-addresses as the number of the areas of the normal cell array 212.

Also, in some embodiments, the normal cell array 212 may be divided into a plurality of areas based on not only distances from the sense amplifier circuit SA in the bit line direction to respective memory cells in the plurality of areas but also locations in the word line direction.

Figure 7:
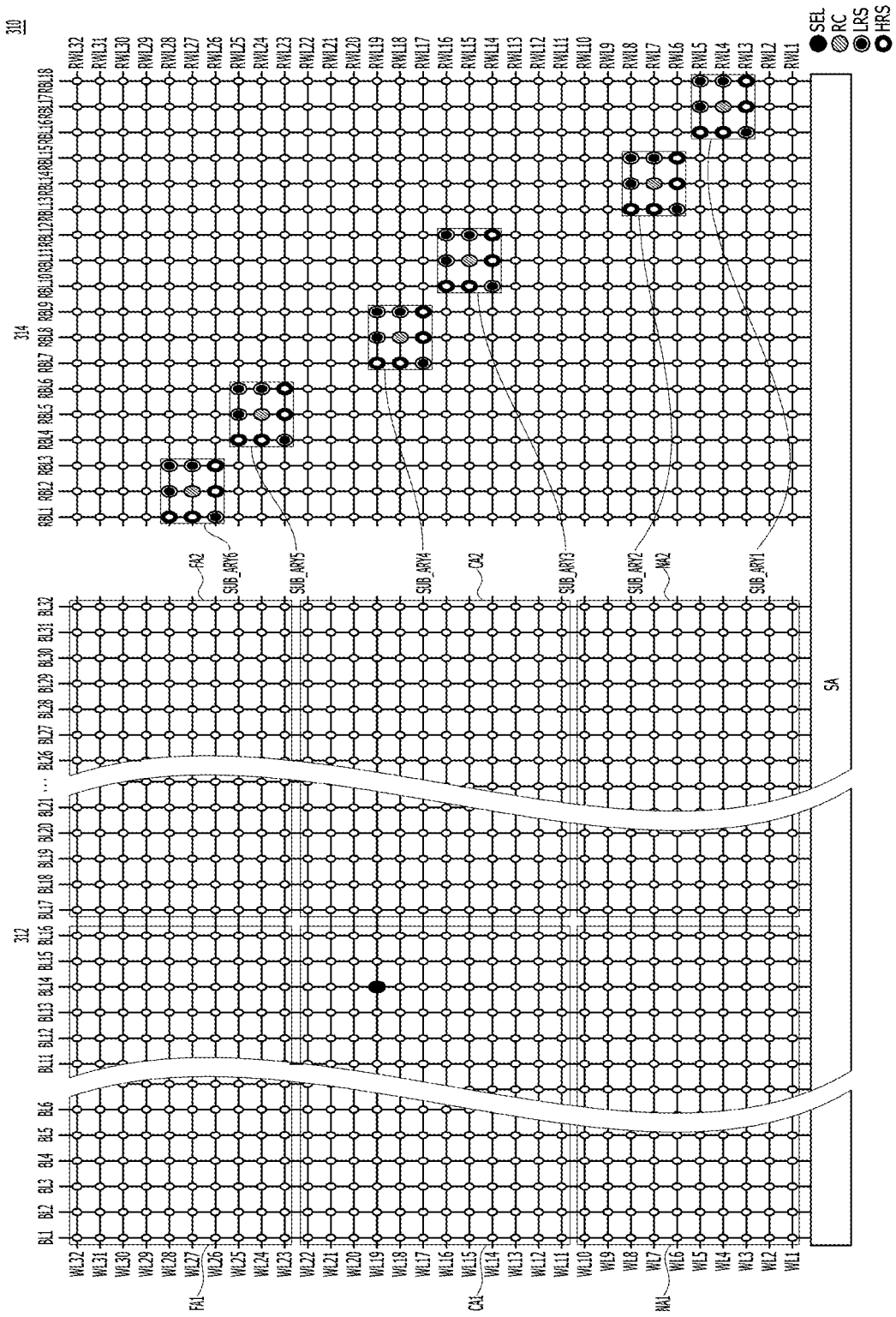
FIG. 7 shows a structure of a memory cell array in accordance with another embodiment of the present disclosure.

FIG. 7 shows a structure of a memory cell array 310 in accordance with another embodiment of the present disclosure.

Referring to FIG. 7, the normal cell array 312 may include a first near area NA1, a second near area NA2, a first center area CA1, a second center area CA2, a first far area FA1, and a second far area FA2. The reference cell array 314 may include first to sixth sub-arrays SUB_ARY1 to SUB_ARY6 corresponding to the respective areas of the normal cell array 312. Herein, the reference cell array 314 may be divided into a near area, a center area, and a far area based on distances from a sense amplifier circuit SA to memory cells in the near area, the center area, and the far area, respectively, and the first and second sub-arrays SUB_ARY1 and SUB_ARY2 may be disposed in the near area of the reference cell array 314, and the third and fourth sub-arrays SUB_ARY3 and SUB_ARY4 may be disposed in the center area of the reference cell array 314, and the fifth and sixth sub-arrays SUB_ARY5 and SUB_ARY6 may be disposed in the far area of the reference cell array 314.

When a memory cell SEL coupled to the $19^{th}$ word line WL19 and the $14^{th}$ bit line BL14 positioned in the first center area CA1 is selected in the normal cell array 312, a reference cell selector (e.g., the reference cell selector 121 in FIG. 4) may generate a reference selection signal REF_SEL to select the fourth sub-array SUB_ARY4 positioned in the center area of the reference cell array 314. Accordingly, a reference cell RC of the fourth sub-array SUB_ARY4 disposed between the $18^{th}$ reference word line RWL18 and the eighth reference bit line RBL8 may be selected.

Similarly, when a memory cell (not shown) that is positioned in the second center area CA2 is selected in the normal cell array 312, a reference cell RC of the third sub-array SUB_ARY3 in the center area of the reference cell array 314 may be selected.

Hereinafter, structures of a memory cell array that supports a repair scheme will be described below with reference to FIGS. 8A to 9B. Referring to FIGS. 8A to 9B, first to third sub-arrays SUB_ARY1 to SUB_ARY3 may be disposed in a diagonal direction of a reference cell array (E.g., a reference cell array 414 of FIGS. 8A and 8B) and be spaced apart from each other by a predetermined distance in the word line direction.

Figure 8A:
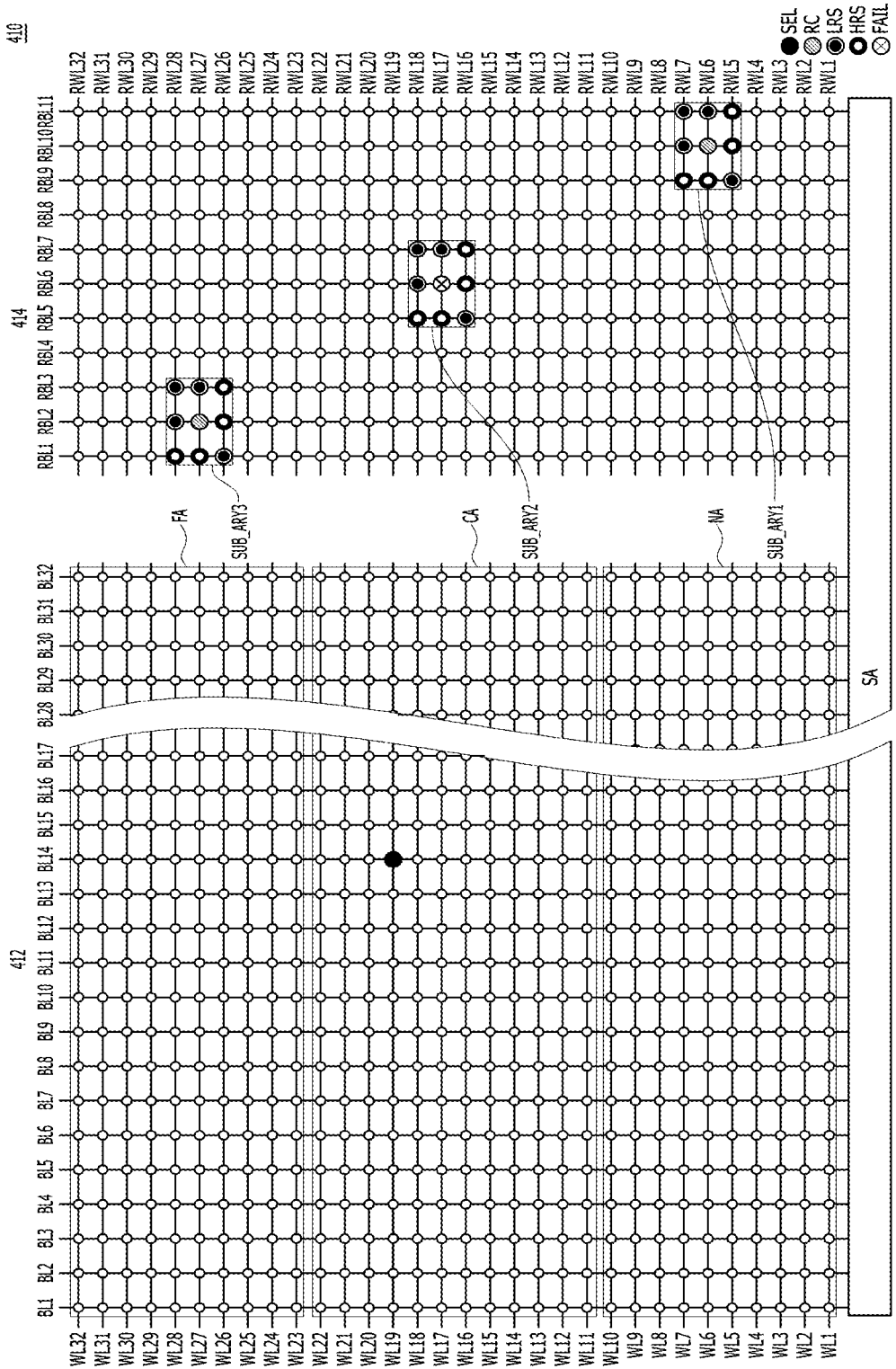
FIGS. 8A and 8B show a structure of a memory cell array implementing a repair scheme in accordance with an embodiment of the present disclosure.
Figure 8B:
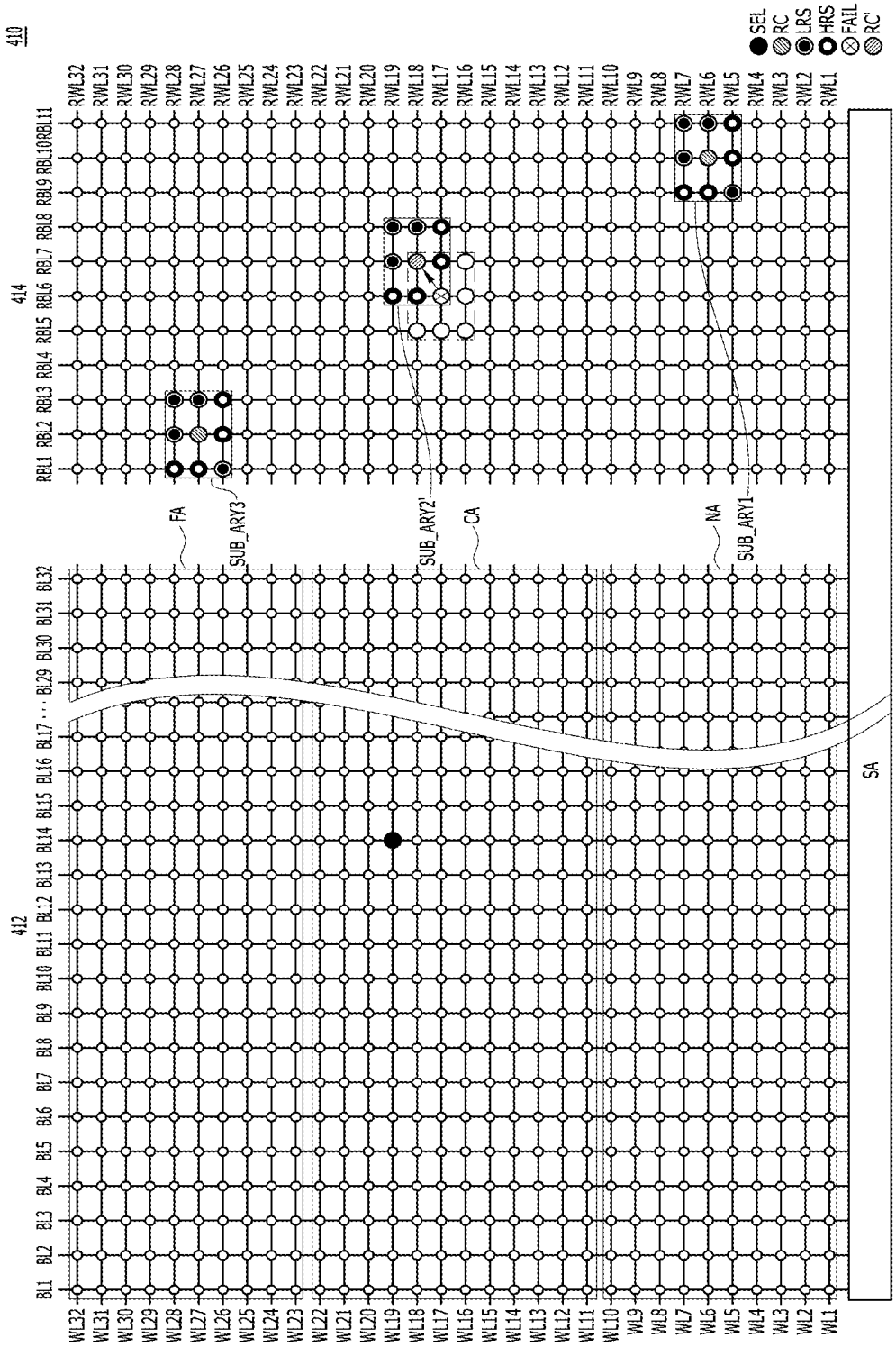

FIGS. 8A and 8B show a structure of a memory cell array 410 in support of a repair scheme in accordance with an embodiment of the present disclosure.

Referring to FIGS. 8A and 8B, first to $32^{nd}$ word lines WL1 to WL32 and first to $32^{nd}$ column lines BL1 to BL32 may be disposed in a normal cell array 412, which includes 1024 memory cells. FIGS. 8A and 8B show an embodiment where the first to $32^{nd}$ reference word lines RWL1 to RWL32 and the first to $11^{th}$ reference bit lines RBL1 to RBL11 may be disposed in the reference cell array 414, which includes 352 memory cells.

The reference cell array 414 may include first to third sub-arrays SUB_ARY1 to SUB_ARY3 that respectively correspond to the near area NA, the center area CA, and the far area FA of the normal cell array 412. The first to third sub-arrays SUB_ARY3 may be disposed in a diagonal direction and may be coupled to different reference bit lines and different reference word lines.

Herein, in order to support the repair scheme, one reference bit line may be disposed between the first to third sub-arrays SUB_ARY1 to SUB_ARY3. For example, the first sub-array SUB_ARY1 may include memory cells disposed between the fifth to seventh reference word lines RWL5 to RWL7 and the ninth to $11^{th}$ reference bit lines RBL9 to RBL11. The second sub-array SUB_ARY2 may include memory cells disposed between the $16^{th}$ to $18^{th}$ reference word lines RWL16 to RWL18 and the fifth to seventh reference bit lines RBL5 to RBL7. The third sub-array SUB_ARY3 may include memory cells disposed between the $26^{th}$ to $28^{th}$ reference word lines RWL26 to RWL28 and the first to third reference bit lines RBL1 to RBL3. That is, an eighth reference bit line RBL8 may be disposed between the first sub-array SUB_ARY1 and the second sub-array SUB_ARY2, and a fourth reference bit line RBL4 may be disposed between the second sub-array SUB_ARY2 and the third sub-array SUB_ARY3.

Herein, when there is a defective reference cell FAIL in the second sub-array SUB_ARY2, one among the neighboring cells AC of the second sub-array SUB_ARY2 may be set as a new reference cell RC'. According to an embodiment of the present disclosure, one among the neighboring cells AC positioned on the diagonal line of the second sub-array SUB_ARY2 may be set as a new reference cell RC', and a new second sub-array SUB_ARY2' including neighboring cells disposed around the new reference cell RC' may be defined. For example, in FIG. 8B, when the defective reference cell FAIL in the second sub-array SUB_ARY2 is coupled to the $17^{th}$ reference word line RWL17 and the $6^{th}$ reference bit line RBL6, a new second sub-array SUB_ARY2' including a new reference cell RC' disposed between the $18^{th}$ reference word line RWL18 and the seventh reference bit line RBL7 may be defined.

Therefore, the sense amplifier circuit SA may sense and amplify a signal indicative of data of a selected memory cell of the normal cell array 412 based on a cell current supplied from the $14^{th}$ bit line BL14 and a reference current supplied from the seventh reference bit line RBL7 during a read operation.

Figure 9A:
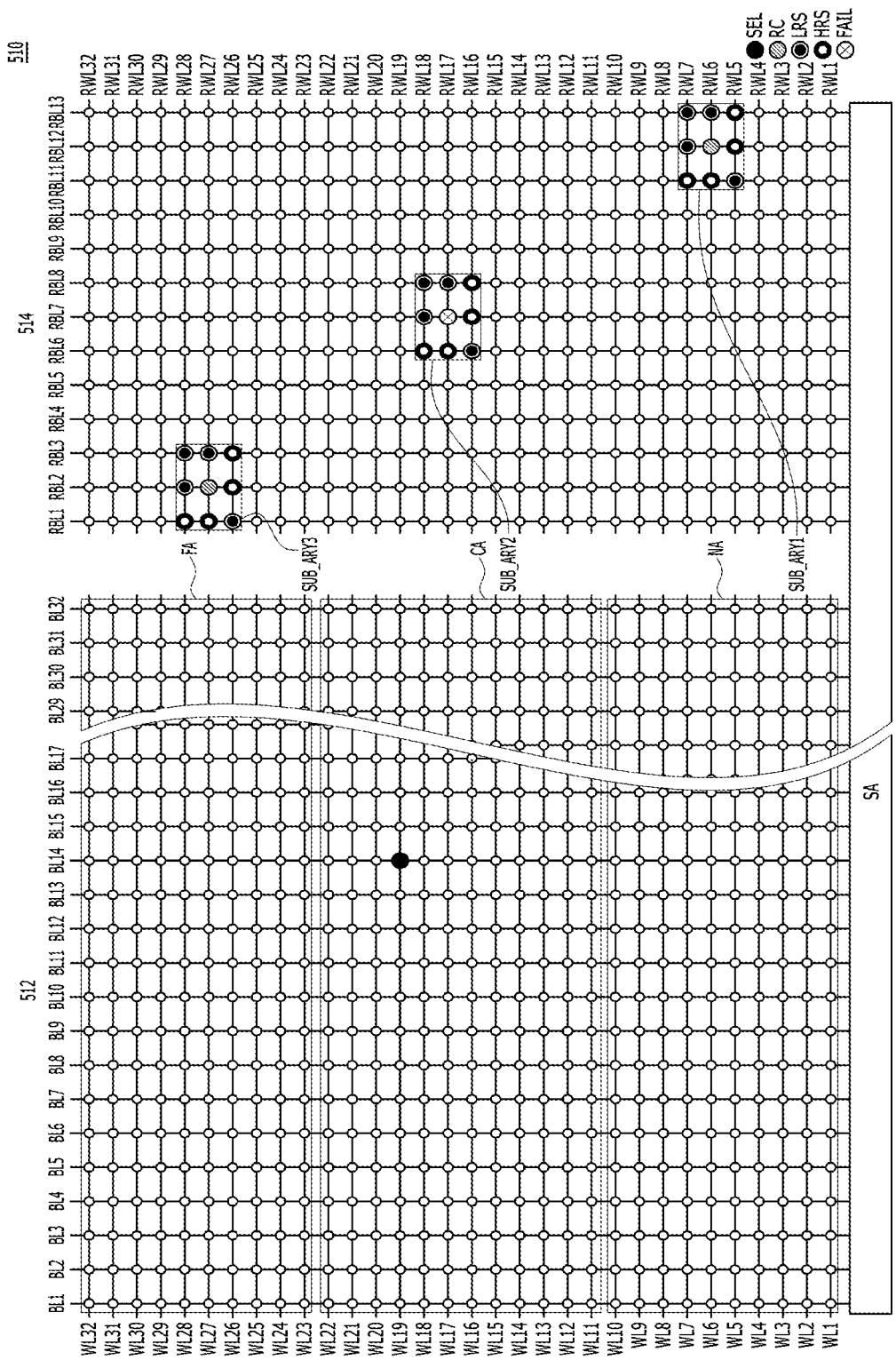
FIGS. 9A and 9B show a structure of a memory cell array implementing a repair scheme in accordance with another embodiment of the present disclosure.
Figure 9B:
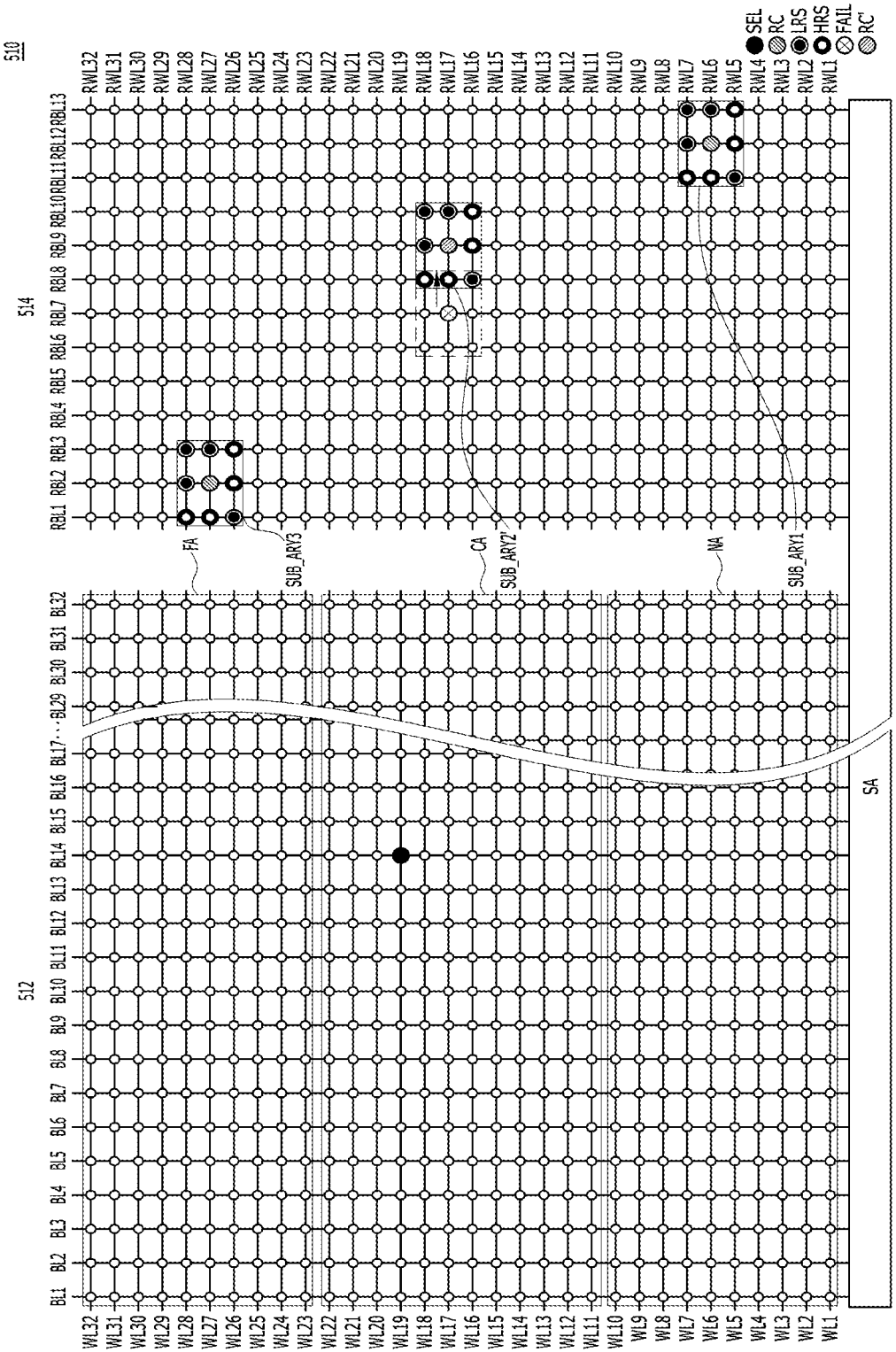

FIGS. 9A and 9B show a structure of a memory cell array 510 in support of a repair scheme in accordance with another embodiment of the present disclosure.

Referring to FIGS. 9A and 9B, first to $32^{th}$ word lines WL1 to WL32 and first to $32^{th}$ column lines BL1 to BL32 may be disposed in a normal cell array 512, which includes 1024 memory cells. FIGS. 9A and 9B show an embodiment where the first to $32^{nd}$ reference word lines RWL1 to RWL32 and the first to $13^{th}$ reference bit lines RBL1 to RBL13 are disposed in a reference cell array 514, which includes 416 memory cells.

In order to support the repair scheme, two reference bit lines may be disposed between the first to third sub-arrays SUB_ARY1 to SUB_ARY3. For example, the first sub-array SUB_ARY1 may include memory cells disposed between the fifth to seventh reference word lines RWL5 to RWL7 and the $11^{th}$ to $13^{th}$ reference bit lines RBL11 to RBL13. The second sub-array SUB_ARY2 may include memory cells disposed between the $16^{th}$ to $18^{th}$ reference word lines RWL16 to RWL18 and the sixth to eighth reference bit lines RBL6 to RBL8. The third sub-array SUB_ARY3 may include memory cells disposed between the $26^{th}$ to $28^{th}$ reference word lines RWL26 to RWL28 and the first to third reference bit lines RBL1 to RBL3. That is, the fourth and fifth reference bit lines RBL4 and RBL5 may be disposed between the third sub-array SUB_ARY3 and the second sub-array SUB_ARY2, and the ninth and tenth reference bit lines RBL9 and RBL10 may be disposed between the second sub-array SUB_ARY2 and the first sub-array SUB_ARY1.

Herein, when there is a defective reference cell FAIL in the second sub-array SUB_ARY2 coupled to the $17^{th}$ reference word line RWL17 and the seventh reference bit lien RBL7, a memory cell that is positioned in the same reference word line RWL17 as the defective reference cell FAIL and positioned in the $7+L^{th}$ or $7-L^{th}$ (where L is a positive integer of 2 or more) neighboring reference bit lines of the reference bit line RBL7 of the defective reference cell FAIL may be set as a new reference cell RC'. According to an embodiment of the present disclosure, a memory cell that is coupled to the same reference word line RWL17 as the defective reference cell FAIL of the second sub-array SUB_ARY2 and coupled to one of the fifth and seventh reference bit lines RBL5 and RBL9 may be set as a new reference cell RC', and a new second sub-array SUB_ARY2' including the new reference cell RC' and neighboring cells disposed around the new reference cell RC' may be defined. For example, in FIG. 9B, a new second sub-array SUB_ARY2' including the new reference cell RC' disposed between the $17^{th}$ reference word line RWL17 and the ninth reference bit line RBL9 may be defined.

Therefore, the sense amplifier circuit SA may sense and amplify a signal indicative of data of a selected memory cell of the normal cell array 512 based on a cell current supplied from the $14^{th}$ bit line BL14 and a reference cell current supplied from the ninth reference bit line RBL9 during a read operation.

Referring to FIGS. 6 to 9B, a reference cell (e.g., the reference cell RC in FIG. 6) in a reference cell array (e.g., the reference cell array 214 in FIG. 6) may not correspond to each of a plurality of memory cells included in each area (e.g., the center area CA in FIG. 6) of a normal cell array (e.g., the normal cell array 212 in FIG. 6) in 1:1, but one sub-array (e.g., the second sub-array SUB_ARY2 in FIG. 6) may correspond to a plurality of memory cells included in each area of the normal cell array. As a result, the reference cell array may occupy a smaller area than the normal cell array.

Hereinafter, a repair operation of the resistive memory device in accordance with an embodiment of the present disclosure will be described with reference to FIGS. 4 to 10.

Figure 10:
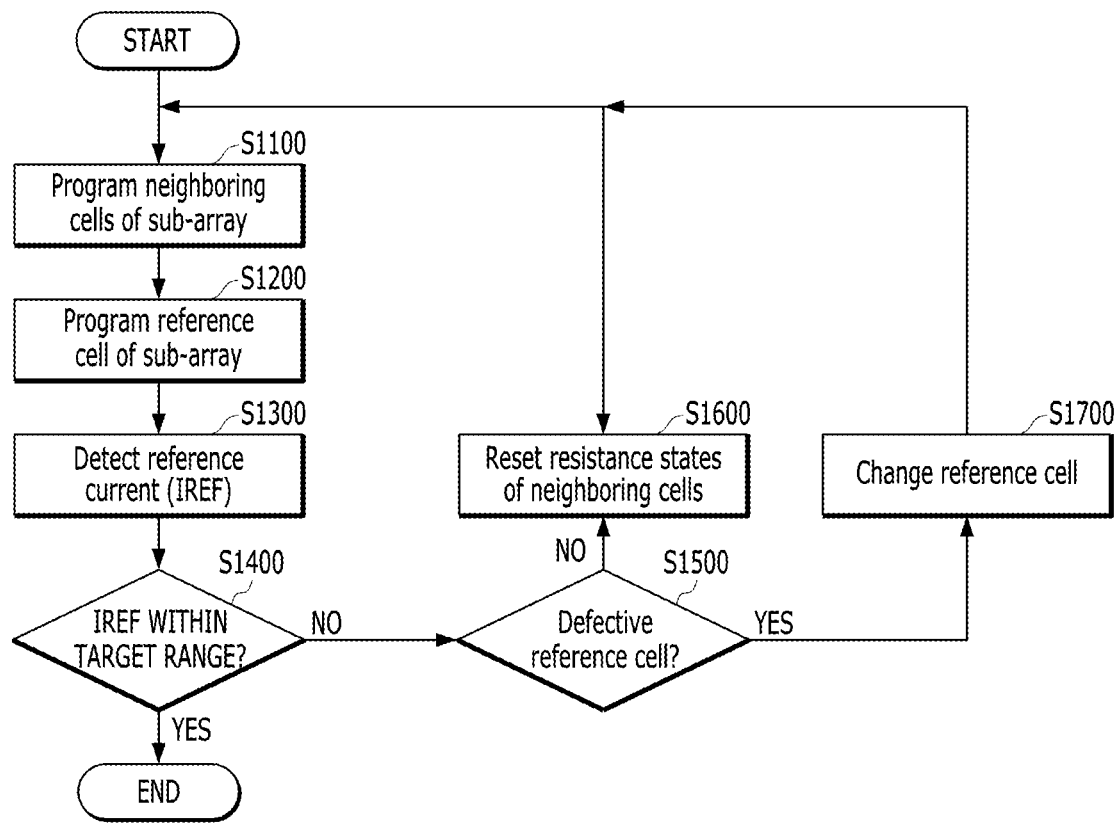
FIG. 10 is a flowchart illustrating a repair operation of a resistive memory device in accordance with an embodiment of the present disclosure.

FIG. 10 is a flowchart illustrating a repair operation of a resistive memory device in accordance with an embodiment of the present disclosure. The repair operation shown in FIG. 10 may be performed in a test mode.

Referring to FIG. 10, when a write driver (e.g., the write driver WDRV in FIG. 4) may program neighboring cells AC (e.g., the neighboring cells AC in FIG. 4) of a particular sub-array (e.g., the sub-array SUB_ARY in FIG. 4) to a first resistance state (e.g., the high resistance state HRS) or a second resistance state (e.g., the low resistance state LRS) through reference bit lines (e.g., the reference bit lines RBL1 to RBLk in FIG. 4) in step S1100.

The write driver WDRV may also program a reference cell (e.g., the reference cell RC in FIG. 4) of the particular sub-array SUB_ARY to have a resistance value between the high resistance state HRS and the low resistance state LRS in step S1200. According to an embodiment of the present disclosure, the reference cell RC may be programmed to have a resistance value which is an average of resistance values of the high resistance state HRS and the low resistance state LRS.

Subsequently, a control logic (e.g., the control logic 127 in FIG. 4) may detect a reference current (e.g., the reference current IREF in FIG. 4) supplied from a reference cell array (e.g., the reference cell array 114 in FIG. 4) in step S1300.

When the reference current IREF is within a target range (YES in step S1400), the repair operation may end.

When the reference current IREF is out of the target range (NO in step S1400), the control logic 127 may decide whether the reference cell RC is a defective cell or not or whether one or more of the resistance states programmed into the neighboring cells AC need to be adjusted (i.e., trimmed) or not. Herein, the control logic 127 may determine that the reference cell RC is a defective cell when the detected reference current IREF does not have a predetermined amount of current. On the other hand, the control logic 127 may determine to adjust (i.e., trim) the resistance states programmed into the neighboring cells AC when the detected reference current IREF has a predetermined amount of current. For example, one or more of the resistance states programmed into the neighboring cells AC may be adjusted to make the amount of the reference current IREF within the target range.

When it is determined that the reference current IREF is out of the target range but the reference cell RC is not a defective cell (NO in step S1500), the control logic 127 may control the resistance states of the neighboring cells AC to be adjusted in step S1600. In other words, the control logic 127 may supply the write control signal WTC to the write driver WDRV to program the neighboring cells AC into another resistance state, which is different from the current resistive state of the neighboring cells AC. Subsequently, the write driver WDRV may supply a write current to the reference bit lines RBL1 to RBLk of the neighboring cells AC based on the write control signal WTC so that at least one of the neighboring cells AC is re-programmed into another resistance state in step S1100. Subsequently, the above operations of the steps S1200 to S1400 may be repeatedly performed.

On the other hand, when it is determined that the reference cell RC is a defective cell (YES in step S1500), the control logic 127 may select a new reference cell (e.g., the new reference cell RC' in FIG. 8B) in step S1700. In other words, the control logic 127 may supply the repair control signal REF_CHANGE to a reference cell selector (e.g., the reference cell selector 121 in FIG. 4). The reference cell selector 121 may set the new reference cell RC' by performing a repair operation described with reference to FIGS. 8A to 9B, and update reference cell selection signals (e.g., the first reference cell selection signal REF_SEL_X and the second reference cell selection signal REF_SEL_Y in FIG. 4) for selecting the new reference cell RC'. When the new reference cell RC' is defined based on the updated first reference cell selection signal REF_SEL_X and the second reference cell selection signal REF_SEL_Y, a new sub-array (e.g., the new sub-array SUB_ARY2' in FIG. 8B) including the new reference cell RC' and a plurality of neighboring cells disposed around the new reference cell RC' may be defined. Subsequently, the above operations of the steps S1100 to S1400 may be repeatedly performed.

Through the above process, when the reference cell RC is determined, a read operation may be performed.

In other words, the cell current ICELL corresponding to the resistance state of the memory cell selected based on the input address ADDR may be supplied from the normal cell array 112. The reference cell selector 121 may generate the reference selection signal REF_SEL so as to select the sub-array according to the position of the selected memory cell based on the input address ADDR. A reference current IREF, which corresponds to to a combination of the resistance states of the memory cells of the sub-array selected based on the generated reference selection signal REF_SEL, may be supplied from the reference cell array 114. The sense amplifier circuit SA may sense and amplify a signal indicative of data of the selected memory cell of the normal cell array 112 based on the cell current ICELL and the reference current IREF.

A resistive memory device in accordance with an embodiment of the present disclosure may be able to secure a sensing margin and minimize a read error by performing position compensation of a memory cell and temperature compensation of a chip to generate the reference current. Also, even if there is a defective reference cell in the reference cell array for generating the reference current, it is possible to repair the defective reference cell, thereby improving the yield.

While the present disclosure has been described with respect to specific embodiments, it will be apparent to those skilled in the art that various changes and modifications may be made without departing from the spirit and scope of the invention as defined in the following claims.

For example, a logic gate and a transistor described in the embodiments of the present disclosure described above may be implemented to have different positions and types according to the polarity of an inputted signal.

What is claimed is:

1. A resistive memory device, comprising:
   a normal cell array suitable for including a plurality of memory cells and generating a cell current according to a resistance state of a memory cell selected among the plurality of memory cells based on an input address;
   a reference cell array suitable for including a plurality of sub-arrays each including a predetermined number of memory cells, and generating a reference current according to a combination of resistance states of memory cells of a sub-array, the sub-array being selected among the plurality of sub-arrays based on a reference selection signal, each of the plurality of sub-arrays including a reference cell and a plurality of neighboring cells disposed around the reference cell, each of the plurality of neighboring cells being programmed into one of a first resistance state and a second resistance state;
   a sense amplifier circuit suitable for sensing and amplifying a signal indicative of data of the selected memory cell based on the cell current and the reference current during a read operation; and
   a reference cell selector suitable for generating the reference selection signal, the sub-array in the reference cell array corresponding to a position of the selected memory cell in the normal cell array.

2. The resistive memory device of claim 1, wherein the selected sub-array includes a reference cell and neighboring cells, the neighboring cells of the selected sub-array being disposed around the reference cell of the selected sub-array and each being programmed into one of the first resistance state and the second resistance state, and
   wherein the reference cell array generates the reference current according to a resistance state of the reference cell of the selected sub-array by performing temperature compensation on the reference current to reflect resistance states of the neighboring cells of the selected sub-array to the reference cell of the selected sub-array.

3. The resistive memory device of claim 2, wherein the reference cell of the selected sub-array is programmed to have a resistance value between a first resistance value of the first resistance state and a second resistance value of the second resistance state.

4. The resistive memory device of claim 3, wherein the first resistance state is a high resistance state, and the second resistance state is a low resistance state.

5. The resistive memory device of claim 1, further comprising:
   a control logic suitable for generating a repair control signal by determining whether a reference cell of the selected sub-array is a defective reference cell or not based on the reference current.

6. The resistive memory device of claim 5, wherein the selected sub-array is a first sub-array, and
   wherein the reference cell selector sets one among neighboring cells of the first sub-array as a new reference cell based on the repair control signal, the neighboring cells of the first sub-array being disposed around the reference cell of the first sub-array and each being programmed into one of the first resistance state and the second resistance state, and the reference cell selector updates the reference selection signal to select a second sub-array including the new reference cell and neighboring cells disposed around the new reference cell.

7. The resistive memory device of claim 6, wherein the reference cell selector sets a neighboring cell of the first sub-array that is disposed on a diagonal line of the first sub-array as the new reference cell.

8. The resistive memory device of claim 5, wherein the defective reference cell is coupled to a first word line and a first bit line, and
   wherein the reference cell selector sets a memory cell that is coupled to the first word line and coupled to a second bit line as the new reference cell, the second bit line being separated from the first bit line by at least one bit line therebetween.

9. The resistive memory device of claim 5, wherein neighboring cells of the selected sub-array are disposed around the reference cell of the selected sub-array and each being programmed into one of the first resistance state and the second resistance state, and
wherein the control logic adjusts one or more of the resistance states programmed into the neighboring cells of the selected sub-array, when the reference current is out of a target range and the reference cell of the selected sub-array is not determined as the defective reference cell.

10. The resistive memory device of claim 1, wherein the reference cell array is disposed on one side of the normal cell array in a word line direction, and
wherein the sense amplifier circuit is disposed on one side of the normal memory cell array in a bit line direction.

11. The resistive memory device of claim 1, wherein the normal cell array is divided into a plurality of areas according to respective distances from the sense amplifier circuit, and
wherein the reference cell array includes the plurality of sub-arrays corresponding to the plurality of areas, respectively.

12. The resistive memory device of claim 1, wherein the plurality of sub-arrays are disposed in a diagonal direction of the reference cell array.

13. The resistive memory device of claim 12, wherein adjacent sub-arrays are spaced apart from each other by a predetermined distance.

14. The resistive memory device of claim 1, wherein the reference cell array occupies a smaller area than an area of the normal cell array.

15. A method for operating a resistive memory device, comprising:
providing a normal cell array including a plurality of memory cells and a reference cell array including a plurality of sub-arrays each including a predetermined number of memory cells;
generating a cell current according to a resistance state of a memory cell selected among the plurality of memory cells by an input address from the normal cell array;
generating a reference selection signal to select a sub-array among the plurality of sub-arrays, the sub-array corresponding to a position of the selected memory cell in the normal cell array;
generating a reference current according to a combination of resistance states of memory cells of the sub-array, the sub-array being selected among the plurality of sub-arrays based on the reference selection signal; and
sensing and amplifying a signal indicative of data of the selected memory cell based on the cell current and the reference current,
wherein each of the plurality of sub-arrays includes a reference cell and a plurality of neighboring cells disposed around the reference cell, each of the plurality of neighboring cells being programmed into one of a first resistance state and a second resistance state.

16. The method of claim 15, wherein the selected sub-array includes a reference cell and neighboring cells, the neighboring cells of the selected sub-array being disposed around the reference cell of the selected sub-array and each being programmed into one of the first resistance state and the second resistance state, and
wherein the reference cell array generates the reference current according to a resistance state of the reference cell of the selected sub-array by performing temperature compensation on the reference current to reflect resistance states of the neighboring cells of the selected sub-array to the reference cell of the selected sub-array.

17. The method of claim 15, further comprising:
generating a repair control signal by determining whether a reference cell of the selected sub-array is a defective reference cell or not based on the reference current.

18. The method of claim 17, wherein the selected sub-array is a first sub-array, the method further comprising:
setting one among neighboring cells of the first sub-array as a new reference cell based on the repair control signal, the neighboring cells of the first sub-array being disposed around a reference cell of the first sub-array and each being programmed into one of the first resistance state and the second resistance state; and
updating the reference selection signal to select a second sub-array including the new reference cell and neighboring cells disposed around the new reference cell,
wherein a neighboring cell of the first sub-array that is disposed on a diagonal line of the first sub-array is set as the new reference cell.

19. The method of claim 17, wherein the defective reference cell is coupled to a first word line and a first bit line, and
wherein a memory cell that is coupled to the first word line and coupled to a second bit line as a new reference cell, the second bit line being separated from the first bit line by at least one bit line therebetween.

20. The method of claim 17, wherein neighboring cells of the selected sub-array are disposed around the reference cell of the selected sub-array and each being programmed into one of the first resistance state and the second resistance state, the method further comprising:
adjusting one or more of the resistance states programmed into the neighboring cells of the selected sub-array, when the reference current is out of a target range and the reference cell of the selected sub-array is not determined as the defective cell.

21. A resistive memory device, comprising:
a normal cell array suitable for including a plurality of memory cells and generating a cell current according to a resistance state of a memory cell selected based on an input address;
a reference cell array suitable for including a sub-array including a predetermined number of memory cells, and generating a reference current according to a combination of resistance states of the memory cells of the sub-array, wherein the sub-array includes a reference cell and a plurality of neighboring cells disposed around the reference cell, each of the plurality of neighboring cells being programmed into one of a first resistance state and a second resistance state; and
a sense amplifier circuit suitable for sensing and amplifying a signal indicative of data of the selected memory cell based on the cell current and the reference current during a read operation.

22. The resistive memory device of claim 21, wherein the reference cell array selects the sub-array corresponding to a position of the selected memory cell in the normal cell array based on the input address.

* * * * *